(12) United States Patent
Moon

(10) Patent No.: US 6,958,719 B2
(45) Date of Patent: Oct. 25, 2005

(54) DIGITAL-TO-ANALOG CONVERTER CIRCUITS INCLUDING INDEPENDENTLY SIZED REFERENCE CURRENT SOURCE TRANSISTORS AND METHODS OF OPERATING SAME

(75) Inventor: Kyeong-tae Moon, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/823,077

(22) Filed: Apr. 13, 2004

(65) Prior Publication Data

US 2005/0052298 A1 Mar. 10, 2005

(30) Foreign Application Priority Data

Sep. 9, 2003 (KR) .................................. 10-2003-0063150

(51) Int. Cl.[7] .............................................. H03M 1/66
(52) U.S. Cl. ....................... 341/135; 341/136; 341/144
(58) Field of Search ............................... 341/133, 135, 341/136, 144, 145, 154

(56) References Cited

U.S. PATENT DOCUMENTS

| 5,646,619 A | * | 7/1997 | Daubert et al. ............. 341/145 |
| 5,798,723 A | * | 8/1998 | Fong ........................... 341/136 |
| 6,295,012 B1 | * | 9/2001 | Greig .......................... 341/136 |
| 6,590,516 B2 | | 7/2003 | Inagaki et al. |
| 6,891,495 B2 | * | 5/2005 | Chen et al. .................. 341/135 |

FOREIGN PATENT DOCUMENTS

| JP | 9191252 | 7/1997 |
| JP | 2002-164788 | 6/2002 |
| KR | 1020000072961 | 5/2000 |

OTHER PUBLICATIONS

Notice to Submit a Response for Korean Patent Application No. 10–2003–0063150 mailed on Mar. 29, 2005.

* cited by examiner

*Primary Examiner*—Howard L. Williams
(74) *Attorney, Agent, or Firm*—Myers Bigel Sibley & Sajovec, P.A.

(57) ABSTRACT

Digital-to-analog converter circuits can include independently sized first and second current source transistors coupled to respective pluralities of first and second current provider transistors in current mirror configurations. The first and second current provider transistors can be sized proportionally to the first and second current source transistors respectively.

26 Claims, 12 Drawing Sheets

FIG. 11

| BIT k=m+n | $2^k$ | m=1 $m/2^n-1$ | m=2 $m/2^n-1$ | m=3 $m/2^n-1$ | m=4 $m/2^n-1$ | m=5 $m/2^n-1$ | m=6 $m/2^n-1$ | m=7 $m/2^n-1$ | m=8 $m/2^n-1$ | m=9 $m/2^n-1$ |
|---|---|---|---|---|---|---|---|---|---|---|
| 2 | 4 | 1/1 | | | | | | | | |
| 3 | 8 | 1/3 | 2/1 | | | | | | | |
| 4 | 16 | 1/7 | 2/3 | 3/1 | | | | | | |
| 5 | 32 | 1/15 | 2/7 | 3/3 | 4/1 | | | | | |
| 6 | 64 | 1/31 | 2/15 | 3/7 | 4/3 | 5/1 | | | | |
| 7 | 128 | 1/63 | 2/31 | 3/15 | 4/7 | 5/3 | 6/1 | | | |
| 8 | 256 | 1/127 | 2/63 | 3/31 | 4/15 | 5/7 | 6/3 | 7/1 | | |
| 9 | 512 | 1/255 | 2/127 | 3/63 | 4/31 | 5/15 | 6/7 | 7/3 | 8/1 | |
| 10 | 1024 | 1/511 | 2/255 | 3/127 | 4/63 | 5/31 | 6/15 | 7/7 | 8/3 | 9/1 |
| 11 | 2048 | 1/1023 | 2/511 | 3/255 | 4/127 | 5/63 | 6/31 | 7/15 | 8/7 | 9/3 |
| 12 | 4096 | 1/2047 | 2/1023 | 3/511 | 4/255 | 5/127 | 6/63 | 7/31 | 8/15 | 9/7 |
| 13 | 8192 | 1/4095 | 2/2047 | 3/1023 | 4/511 | 5/255 | 6/127 | 7/63 | 8/31 | 9/15 |
| 14 | 16384 | 1/8191 | 2/4095 | 3/2047 | 4/1023 | 5/511 | 6/255 | 7/127 | 8/63 | 9/31 |
| 15 | 22768 | 1/16383 | 2/8191 | 3/4095 | 4/2047 | 5/1023 | 6/511 | 7/255 | 8/127 | 9/63 |
| 16 | 45536 | 1/22767 | 2/16383 | 3/8191 | 4/4095 | 5/2047 | 6/1023 | 7/511 | 8/255 | 9/127 |

DIGITAL-TO-ANALOG CONVERTER CIRCUITS INCLUDING INDEPENDENTLY SIZED REFERENCE CURRENT SOURCE TRANSISTORS AND METHODS OF OPERATING SAME

CROSS-REFERENCE TO RELATED APPLICATIONS

This application is related to and claims priority to Korean Patent Application No. 2003-63150, filed on Sep. 9, 2003, the entire content of which is incorporated herein by reference.

FIELD OF THE INVENTION

The invention relates to the field of electronic circuits in general, and more particularly, to digital-to-analog converter (DAC) circuits and methods.

BACKGROUND

In a current addition type digital-to-analog converter (DAC), each of the bits in a digital signal is provided to a switch that controls current flow in a separate branch of the DAC. When a bit provided to one of the switches is "on", the switch is closed, thereby enabling current to flow in the respective branch. The DAC can operate (to provide an analog output signal) by adding all of the currents flowing in each of the braches in response to all of the bits in the digital signal being provided to the DAC. A 10-bit current addition type DAC is discussed, for example, in Korean Laid Open Patent Publication No. 2000-0072961.

FIG. 1 is a schematic diagram showing a conventional 10-bit current addition type DAC having a current compensation circuit. Referring to FIG. 1, the 10-bit current addition type DAC includes a plurality of PMOS transistors MP1, MP2, . . . , MP36. The PMOS transistors MP1, MP2, . . . , MP36, are coupled to a current source PMOS transistor MPREF in a current-mirror configuration to provide respective outputs currents I, 2I, . . . , 32I, where 2I is twice the current I and 32I is 32 times the current I etc. A plurality of switches SW1, SW2, . . . , SW36 are connected between drain electrodes of the PMOS transistors MP1, MP2, . . . , MP36 and an output terminal OUT. The switches operate in response to the digital input signals D1, D2, . . . , D36. The lower 5 bits of the 10 bit input signal are applied to the switches SW1, SW2, . . . , SW5, whereas the upper 5 bits of the 10 bit input signal are decoded to provide 31 separate signals. The 31 separate signals are applied to the switches SW6, SW7, . . . , SW36 respectively.

The current addition type DAC further includes a current compensation circuit 10. The current compensation circuit 10 can regulate the currents flowing through the PMOS transistors MP1, MP2, . . . , and MP36 when the currents flowing through the PMOS transistors MP1, MP2, . . . , MP36 have abnormal amplitudes. The currents output by the PMOS transistors MP1, MP2, . . . , MP36 are coupled to turned-on switches and are added altogether and applied to an output resistance RO to develop a voltage across the output resistor RO. In particular, the voltage at the output terminal OUT is equal to the sum of a reference voltage VREF coupled to one terminal of the output resistor RO and the voltage at the output resistor RO. The DAC outputs an analog signal at the output terminal OUT corresponding to the digital input signals D1, D2, . . . , D36.

The ratios of the currents (i.e., I, 2I, . . . 32I) flowing through the PMOS transistors MP1, MP2, . . . , MP36 are determined by the respective sizes of the PMOS transistors MP1, MP2, . . . , MP36 so that the larger the transistor size, the larger the current that may flow when the transistor is turned on. For example, transistor MP36 may be 32 times larger than MP1 so that the current (32I) generated by MP36 is 32 times greater than the current generated by MP1. Thus, the chip size may increase when the current addition type digital-to-analog converter is implemented in an integrated circuit.

Referring again to FIG. 1, when the transistor size of the PMOS transistor MP1 coupled to the lowest bit D1 is assumed as 1, the transistor sizes of the PMOS transistors MP2, MP3, MP4 and MP5 are 2, 4, 8, 16, respectively, and the transistor sizes of the PMOS transistors MP6, . . . , and MP36 are 32. The size of each of the PMOS transistors MP1, MP2, MP3, MP4 and MP5 (corresponding to lower 5 bits of the digital signal) increases according to the expression $2^k$ relative to the immediate lower order transistor. In particular, MP2 is twice as large as MP1, MP3 is twice as large as MP2, MP4 is twice as large as MP3, and MP5 is twice as large as MP4 so that the MP5 is 16 times are large as MP1. Further, the PMOS transistors MP6, MP7, . . . , and MP36 are each twice as large as MP5 (and 32 times larger than MP1).

In addition, it may be difficult to increase the precision (or accuracy) of the conventional DAC of FIG. 1, as the size of the DAC may increase significantly as the number of bits in the digital input increases. The total area needed for an N bit DAC can be expressed as the total number transistors needed for the DAC, where each of the transistors occupies a unit area (i.e., 1 unit area). For example, the area needed for a 10 bit DAC can be expressed as: (1+2+4+8+16)+(32×31)=1023 unit areas, where each of the areas represents the size occupied by the PMOS transistors MP1, MP2, . . . , MP36 respectively. Extending this expression to a higher resolution 12 bit DAC, the total area occupied by PMOS transistors can be expressed as: (1+2+4+8+16+32)+(64×63), or 4095 unit areas. Accordingly, when the structure shown in FIG. 1 is increased to provide a 12 bit DAC, the chip size of the DAC may increase by 4 times.

In the conventional DAC of FIG. 1, the transistors MP1, MP2, . . . , MP36 are connected to the reference transistor MPREF in a current mirror configuration. Thus, the transistor sizes of the PMOS transistors MP6, . . . , MP36 corresponding to upper bits of the digital input signal should be designed to have two times larger than the transistor size of the PMOS transistor MP5 corresponding to the upper most bit D5. The number of the PMOS transistors MP6, . . . , MP36 corresponding to upper bits of the digital input signal is 31, which causes an increase in the total chip size of the digital-to-analog converter when the transistor sizes of the PMOS transistors MP6, . . . , MP36 are designed to be 32 times larger than the transistor size of the PMOS transistor MP1 corresponding to the lower most bit D1.

Another current addition type DAC is discussed, for example, in Japanese Patent Laid Open Publication No. 1997-191252. The current addition type DAC of the above Japanese Patent Publication includes two current providers, and a transistor having a size, which acts as a current source, connected to a first current provider that is different from a transistor size of a transistor, which acts as a current source, connected to a second current provider. Thus, the chip size of the digital-to-analog converter may be reduced. Particularly, in the current addition type digital-to-analog converter of the above Japanese Patent Publication, the current provider includes a MOS transistor and a resistor connected to a source electrode thereof, and the switch to which an digital input signal is inputted is connected to a gate electrode of the MOS transistor. In addition, the ratio of the currents provided from the current provider is determined by the ratio of the resistances of the resistors connected to the MOS transistors of the current provider.

SUMMARY

Embodiments according to the invention can provide digital-to-analog converter circuits including independently sized reference current source transistors. Pursuant to these embodiments, independently sized first and second current source transistors can be coupled to respective pluralities of first and second current provider transistors in current mirror configurations. The first and second current provider transistors are sized proportionally to the first and second current source transistors respectively.

In some embodiments according to the invention, a first current provider circuit is configured to provide a plurality of first current signals responsive to a plurality of first bits of an N bit data word weighted differently based on a first reference current and a second current provider circuit is configured to provide a plurality of second current signals responsive to a plurality of second bits of the N bit data word weighted equally based on a second reference current that is different than the first reference current.

In some embodiments according to the invention, the first current provider circuit includes a plurality of transistors of different sizes based on the first reference current. In some embodiments according to the invention, the different sizes of the plurality of transistors are further based respective orders of data bits of the N bit data word to which each of the respective transistors is coupled.

In some embodiments according to the invention, the first current signals have associated respective magnitudes determined based on the different sizes of the plurality of transistors. In some embodiments according to the invention, respective source/drain terminals of the plurality of transistors are coupled to the plurality of first bits. In some embodiments according to the invention, the plurality of transistors includes a plurality of first transistors, wherein the second current provider circuit includes a plurality of second transistors of about equal sizes based on the second reference current.

In some embodiments according to the invention, a first current source transistor is coupled to the plurality of first transistors that is configured to provide the first reference current, wherein the first current source transistor has a size about equal to a lowest order one of the plurality of first transistors. A second current source transistor is coupled to the plurality of second transistors that is configured to provide the second reference current, wherein the second current source transistor has a size about equal to all of the plurality of second transistors. In some embodiments according to the invention, the first and second current source transistors are sized independently of one another.

In some embodiments according to the invention, source/drain terminals of the pluralities of first and second transistors are not coupled to separate resistor components. In some embodiments according to the invention, source/drain terminals of the pluralities of first and second transistors are each coupled to respective switches configured to switch respective bits of the N bit data word to the ones of the pluralities of first and second transistors.

In some embodiments according to the invention, the plurality of first bits include lower order bits of the N bit data word and the plurality of second bits include high order bits of the N bit data word that are higher order than the plurality of first bits, wherein the second reference current is about $2^m$ times as large as the first reference current, wherein m equals a lowest order one of the high order bits.

In some embodiments according to the invention, the first current provider circuit includes a plurality of first transistors having different respective sizes relative to one another and the second current provider circuit includes a plurality of second transistors having about equal sizes relative to one another. In some embodiments according to the invention, first and second current source transistors are coupled to the first and second current provider circuits respectively. A current correction circuit is coupled to the first and second current provider circuits and is coupled to at least one of the first and second current source transistors and is configured to change at least one of the first and second reference currents based on a difference between voltage levels provided by the first and second current provider circuits.

In some embodiments according to the invention, the current correction circuit is coupled to the first and second current source transistors and is configured to change the first and second reference currents based on the difference. In some embodiments according to the invention, the current correction circuit includes an analog-to-digital converter circuit to convert the voltage levels provided by the first and second current provider circuits to decoded digital signals representing a correction to the first or second reference current.

In some embodiments according to the invention, a plurality of current correction transistors are coupled to the analog-to-digital converter circuit and at least one of the first and second current source transistors and are responsive to the decoded digital signals to change the first and second reference currents.

In some embodiments according to the invention, an N bit Digital-to-Analog Converter (DAC) includes a current correction circuit configured to change at least one of first and second reference currents provided in proportion to respective sizes of transistors included in associated first and second current provider circuits based on a difference between voltage levels provided by the first and second current provider circuits.

In some embodiments according to the invention, first and second current source transistors are coupled to the first and second current provider circuits respectively. The current correction circuit is coupled to the first and second current source transistors and is configured to change the first and second reference currents based on the difference.

In some embodiments according to the invention, the current correction circuit includes an analog-to-digital converter circuit to convert the voltage levels provided by the first and second current provider circuits to decoded digital signals representing a correction to the first or second reference current.

In some embodiments according to the invention, a plurality of current correction transistors are coupled to the analog-to-digital converter circuit and to at least one of the first and second current source transistors and are responsive to the decoded digital signals to change the first and second reference currents.

In some method embodiments according to the invention, an N bit Digital-to-Analog Converter (DAC) can operate by providing a plurality of first current signals responsive to a plurality of first bits of an N bit data word weighted differently based on a first reference current and by providing a plurality of second current signals responsive to a plurality of second bits of the N bit data word weighted equally based on a second reference current that is different than the first reference current.

In some method embodiments according to the invention, the plurality of first current signals are provided by a plurality of transistors of different sizes based on the first reference current. In some method embodiments according to the invention, the different sizes of the plurality of transistors are further based respective orders of data bits of the N bit data word to which each of the respective transistors is coupled. In some method embodiments according to the invention, the first current signals have associated respective magnitudes determined based on the different sizes of the plurality of transistors. In some method embodiments according to the invention, respective source/drain terminals of the plurality of transistors are coupled to the plurality of first bits.

BRIEF DESCRIPTION OF THE DRAWINGS

FIG. 11 is a table showing examples of the combination of the transistor sizes in first and second current providers circuits included in digital-to-analog converters according to some embodiments of the invention.

Figure 1:
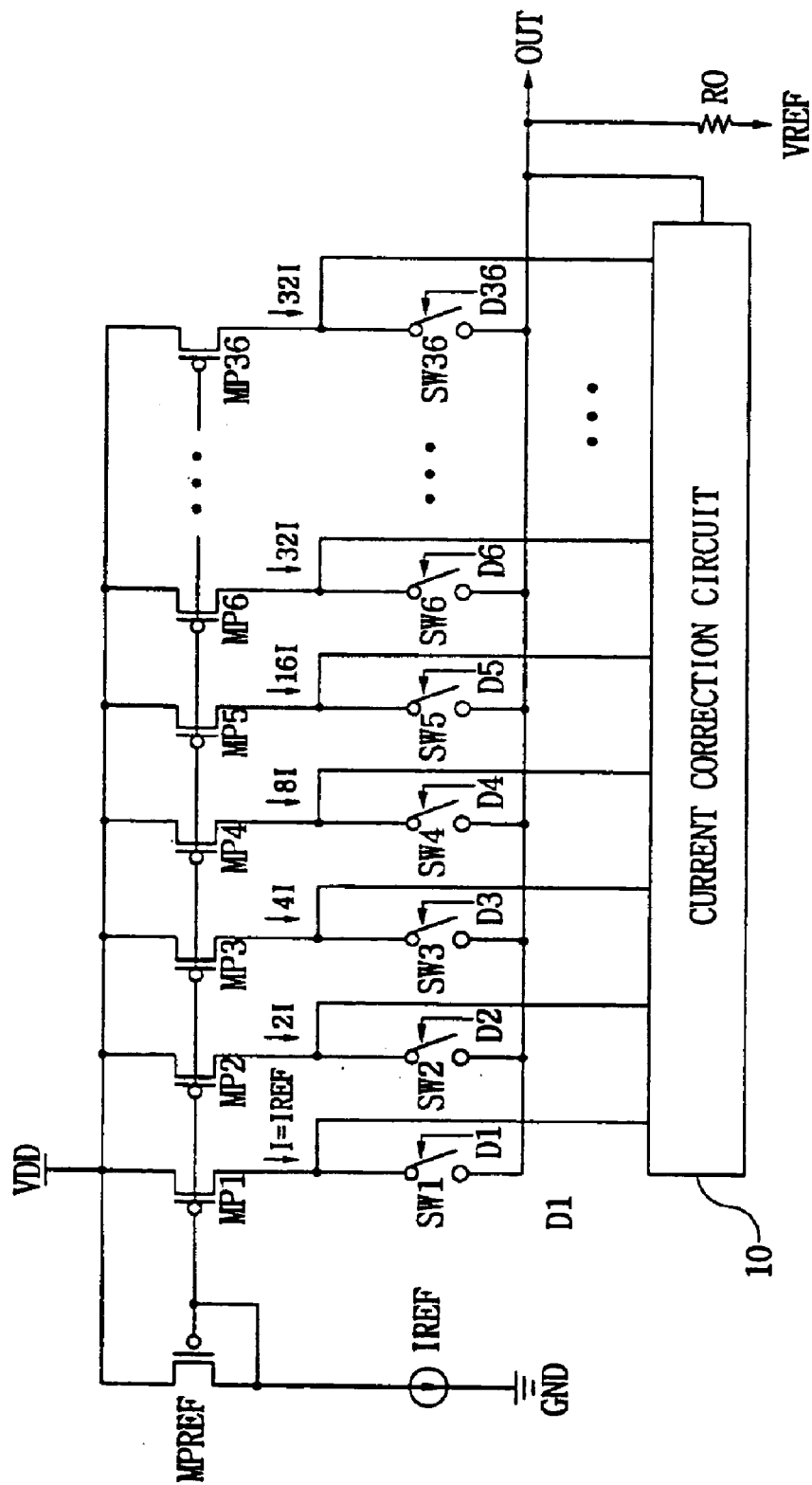
FIG. 1 is a schematic diagram showing a conventional 10-bit current addition type digital-to-analog converter having a current compensation circuit.

DESCRIPTION OF EMBODIMENTS
ACCORDING TO THE INVENTION

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "lower" or "upper" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first region, layer or section discussed below could be termed a second region, layer or section, and, similarly, a second region, layer or section could be termed a first region, layer or section without departing from the teachings of the present invention.

Figure 2:
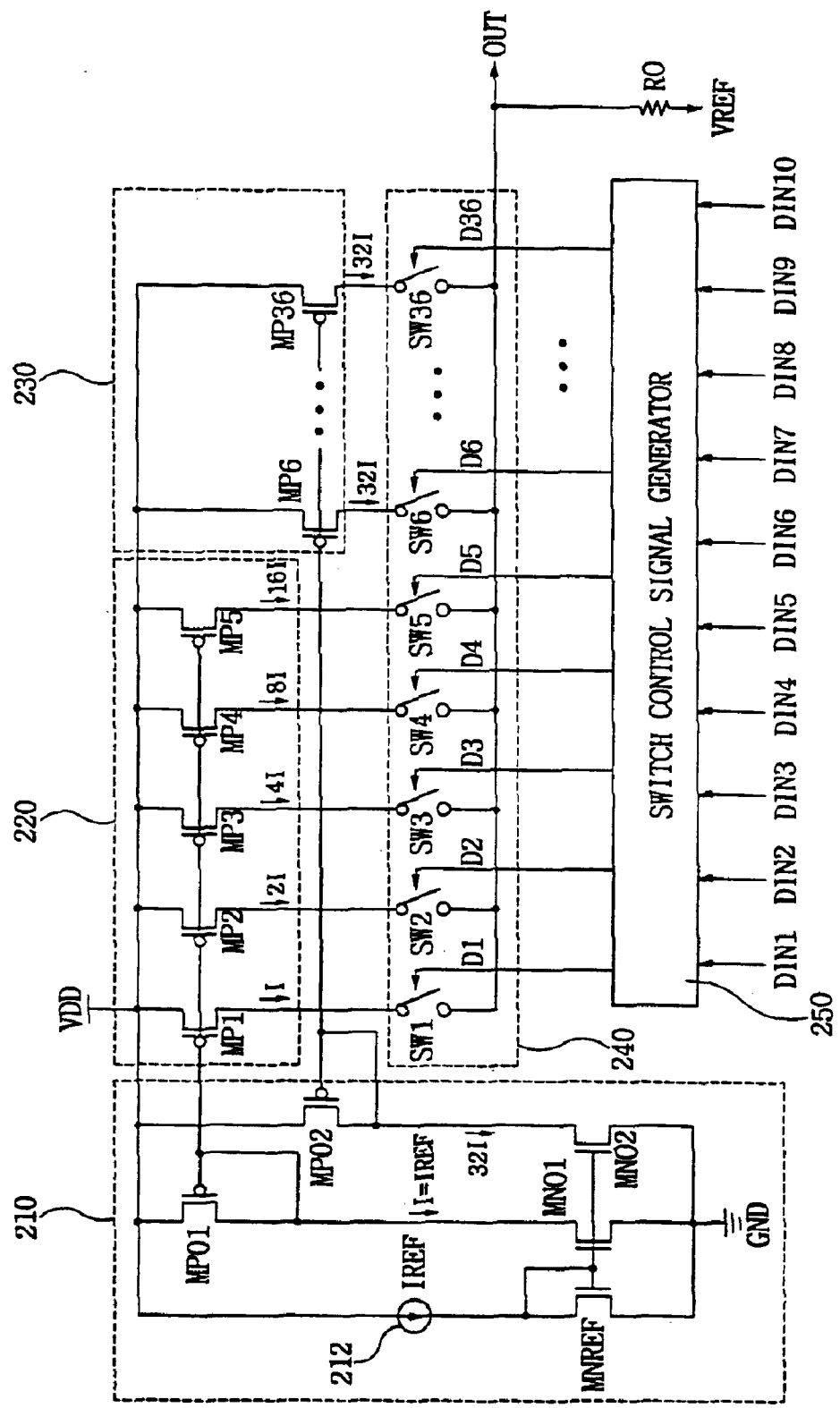
FIG. 2 is a circuit diagram showing a 10-bit current addition type digital-to-analog converter according to some embodiments of the invention.

Referring to FIG. 2, the current addition type digital-to-analog converter (DAC) includes a current source 210, a first current provider 220, a second current provider 230, a switching section 240 and a switch control signal generator 250. An output resistor RO is connected between an output terminal OUT and a reference voltage VREF. The reference voltage VREF is referred to as an output voltage of the DAC when digital input signals representing a digital value of "0" are input to the DAC. A switch control signal generator 250 receives a 10-bit digital input signal including individual bits via DIN1, DIN2, . . . , DIN10 to generate $(5+(2^5-1))$ switch control signals D1, D2, . . . , D36.

The current source 210 includes a reference current source 212, a first NMOS transistor MNREF, a second NMOS transistor MNO1, a third NMOS transistor MNO2, a first PMOS transistor MPO1 and a second PMOS transistor MPO2. A first terminal of the reference current source 212 is coupled to a power voltage VDD, and generates a reference current signal IREF. The first PMOS transistor MPO1 is configured as a diode structure, and generates a first current signal I. The second PMOS transistor MPO2 is configured as a diode structure, and generates a second current signal 32I. The first NMOS transistor MNREF has a drain electrode and a gate electrode that are commonly connected to a second end of the reference current source 212. A gate electrode of the second NMOS transistor MNO1 is connected to a gate electrode of the first NMOS transistor MNREF, a source electrode of the second NMOS transistor MNO1 is connected to an earth potential (such as a reference voltage), a drain electrode of the second NMOS transistor MNO1 is connected to a drain electrode of the first PMOS transistor MPO1. A gate electrode of the third NMOS transistor MNO2 is connected to the gate electrode of the first NMOS transistor MNREF, a source electrode of the third NMOS transistor MNO2 is connected to the earth potential, a drain electrode of the third NMOS transistor MNO2 is connected to a drain electrode of the second PMOS transistor MPO2.

The first current provider 220 includes PMOS transistors MP1, . . . , MP5 coupled in a current mirror configuration. The PMOS transistors MP1, . . . , MP5 are commonly connected to the first PMOS transistor MPO1 of the current source 210. The first current provider 220 generates different current signals having different amplitudes (I, 2I, 4I, 8I and 16I) via PMOS transistors MP1, . . . , MP5 coupled to respective switches in the switching section 240.

The second current provider 230 includes PMOS transistors MP6, . . . , MP36 coupled in a current mirror configuration. The PMOS transistors MP6, . . . , MP36 are commonly connected to the second PMOS transistor MPO2 of the current source 210. The second current provider 230 generates current signals having same amplitudes (32I). The switching section 240 is connected between output terminals of the first and second current providers 220 and 230 and the output terminal OUT of the DAC. The switching section 240 includes a plurality of switches SW1, . . . , SW36. The switches SW1, . . . , SW36 perform a switching operation in response to switch control signals provided by the switching section 240.

According to the DAC of FIG. 2, the first current provider 220 has 5 PMOS transistors MP1, ..., MP5, and the second current provider 230 has 31 PMOS transistors MP6, ..., MP36 so as to convert the 10-bit digital input signals into an analog signal.

Figure 3:
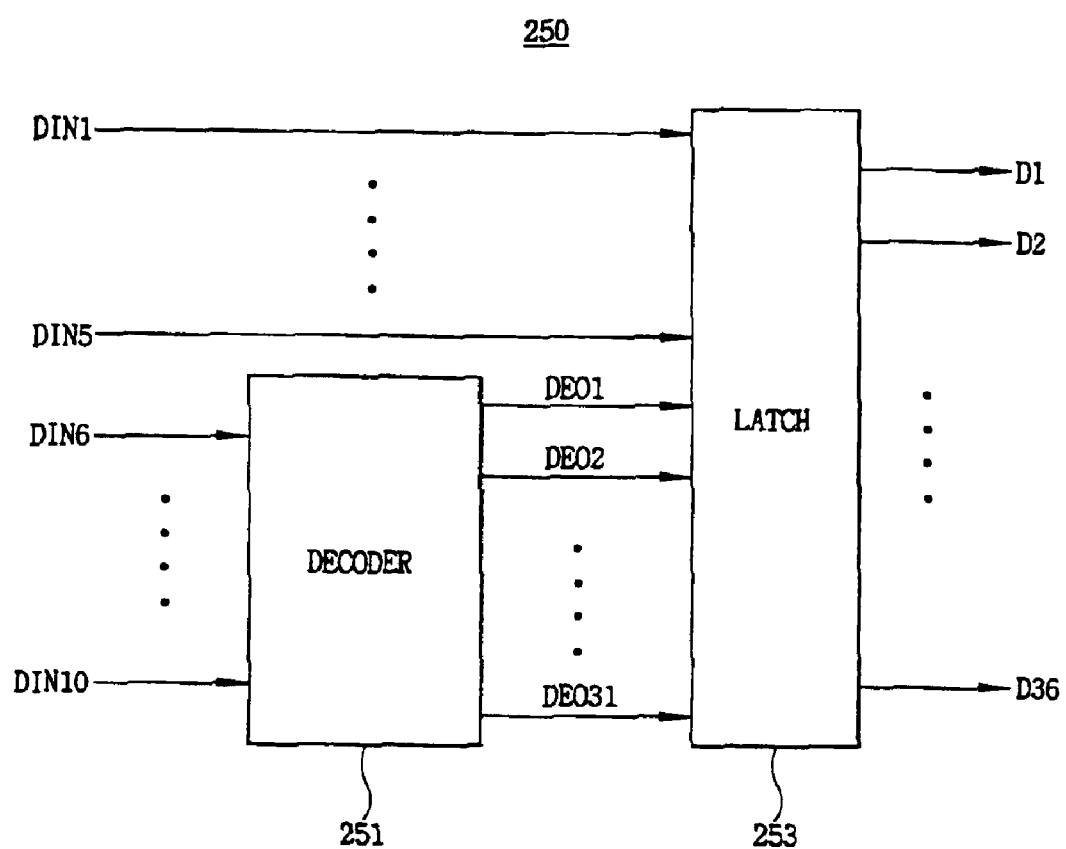
FIG. 3 is a block diagram showing a switch control signal generator of FIG. 2.

FIG. 3 is a block diagram showing a switch control signal generator of FIG. 2. Referring to FIG. 3, the switch control signal generator 250 includes a decoder 251 and a latch circuit 253. In operation, the decoder 251 decodes upper bits DIN6, ..., DIN10 among the digital input signals DIN1, ..., DIN10 to generate $(2^5-1)$ digital signals DE01, ..., DE031. The latch circuit 253 latches lower bits DIN1, ..., DIN5 of digital input signals DIN1, ..., DIN10 and the decoded $(2^5-1)$ digital signals. The latch circuit 253 thereby outputs the $(5+(2^5-1))$ switch control signals D1, D2, ..., D36 to the switching section 240.

The first, second and third NMOS transistors MNREF, MNO1 and MNO2 are connected in a current-mirror configuration. For example, the second NMOS transistor MNO1 has a same transistor size as the first NMOS transistor MNREF. For example, the third NMOS transistor MNO2 has a transistor size 32 times larger than that of the second NMOS transistor MNO1.

When threshold voltages of the first, second and third NMOS transistors MNREF, MNO1 and MNO2 are the same, a current I output from the drain electrode of the second NMOS transistor MNO1 may have the same amplitude as a current IREF output from the drain electrode of the first NMOS transistor MNREF. Further, a current output from the drain electrode of the third NMOS transistor MNO2 may have an amplitude 32 times larger than the current I output from the drain electrode of the second NMOS transistor MNO1.

Since the first PMOS transistor MPO1 is configured as a diode structure and the drain electrode of the first PMOS transistor MPO1 is connected to the drain electrode of first second NMOS transistor MNO1, the current output from the drain electrode of the first PMOS transistor MPO1 may be substantially the same as the current I output from the drain electrode of the second NMOS transistor MNO1.

Since the second PMOS transistor MPO2 is configured as a diode structure and the drain electrode of the second PMOS transistor MPO2 is connected to the drain electrode of third NMOS transistor MNO2, the current output from the drain electrode of the second PMOS transistor MPO2 may be substantially the same as the current 32I output from the drain electrode of the third NMOS transistor MNO2.

The PMOS transistors MP1, ..., MP5 of the first current provider 220 are connected in a current-mirror configuration. The gate electrodes of the PMOS transistors MP1, ..., MP5 are connected to the gate electrode of the first PMOS transistor MPO1 of the current source 210. In some embodiments according to the invention, the PMOS transistor MP1 has the same transistor size as the first PMOS transistor MPO1, the PMOS transistor MP2 has a size two times larger than that of the PMOS transistor MP1, the PMOS transistor MP3 has a size two times larger than that of the PMOS transistor MP2, the PMOS transistor MP4 has a size two times larger than that of the PMOS transistor MP3, and the PMOS transistor MP5 has a size two times larger than that of the PMOS transistor MP4. Thus, the currents generated by the PMOS transistors MP1, ..., and MP5, have the relationship to one another of I, 2I, 4I, 8I and 16I respectively. Namely, the output currents of the PMOS transistors MP1, ..., and MP5 are generated according to the relationship: $2^k$ wherein k represents the order of the bit to which the respective PMOS transistor MP1, ..., and MP5 is connected to. For example, the output current generated by MP2 can be equal to $2^1$ times the current IREF as MP2 is connected to the $1^{st}$ order bit in the 10 bit input via the switch control signal generator 250.

The PMOS transistors MP6, ..., MP36 of the second current provider 230 are connected in a current-mirror configuration. The gate electrodes of the PMOS transistors MP6, ..., MP36 are connected to the gate electrode of the second PMOS transistor MPO2 of the current source 210. In some embodiments according to the invention, the PMOS transistors MP6, ..., MP36 are the same size as one another. Thus, each of the currents output by the PMOS transistors MP6, ..., MP36 has an amplitude of 32I as this is this current sourced by the second PMOS transistor MPO2.

The 10-bit digital input signals DIN1, ..., DIN10 are converted by the switch control signal generator 250 into $(5+(2^5-1)=36)$ switch control signals D1, D2, ..., D36. The lower 5 bits D1, ..., D5 of the 36-bit switch control signals D1, ..., D36 are respectively input to switches SW1, ..., SW5 of the switching section 240. The switch control signal D1 is the least significant bit (LSB) and is input to the switch SW1, the switch control signal D2 is input to the switch SW2, the switch control signal D3 is input to the switch SW3, the switch control signal D4 is input to the switch SW4, and the switch control signal D5 is input to the switch SW5.

The upper 5 bits DIN6, ..., DIN10 of the 10-bit digital input signals DIN1, ..., DIN10 are decoded (by the decoder 251 of FIG. 3) to provide 31-bit data DEO1, ..., DEO31, which are input to the switches SW6, ..., SW36, respectively. There may be no priority among the 31-bit switch control signals D6, ..., D36. In other words, each of the 31-bit switch control signals D6, ..., D36 are weighted the same.

When the switch control signals D6, ..., D36 are all '0' (such as when the digital input signals DIN1, ..., DIN10 are all '0'), the value of the reference voltage VREF is provided at the output terminal OUT. In contrast, when the switch control signal D1 is '1' and the other switch control signals D2, D3, ..., D36 are all '0', the switch SW1 is in the on state ("on"), and the other switches SW2, SW3, ..., SW36 are off. The current signal I, provided by MP1, is applied to the output resistor RO to generate a voltage level about equal to: VREF+I×RO at the output terminal OUT.

When the switch control signal D2 is '1' and the other switch control signals D1, D3, ..., D36 are all '0', the switch SW2 is turned on, and the other switches SW1, SW3, ..., SW36 are turned off. The current signal 2I, provided by MP2, is applied to the output resistor RO to generate a voltage level about equal to VREF+2×I×RO at the output terminal OUT.

When the switch control signals D1 and D2 are '1' and the other switch control signals D3, D4, ..., D36 are all '0', the switches SW1 and SW2 are turned on, and the other switches SW3, SW4, ..., SW36 are turned off. The current signals, I and 2I provided by PMOS transistors MP1 and MP2 respectively, are applied to the output resistor RO to generate a voltage level about equal to: VREF+(1+2)×I×RO, at the via the output terminal OUT.

As a further example of operation of the DAC, when the switch control signals D1, D2, ..., and D5 are '1' and the other switch control signals D6, D7, ..., D36 are all '0', the switches SW1, SW2, ..., and SW5 are turned on, and the other switches SW6, SW7, ..., SW36 are turned off. The current signals, I, 2I, 4I, 8I, and 16I provided by PMOS transistors MP1, MP2, . . . , and MP5, respectively, are applied to the output resistor RO to generate a voltage level about equal to: VREF+(1+2+4+8+16)×I×RO, at the output terminal OUT.

The first current provider 220 may provide different currents to generate 32 different voltages, such as (0×RO+VREF) to (31I×RO+VREF). Since the 31-bit switch control signals D6, . . . , D36 input into the switching section 240 do not have relative priority to one another, 32 different voltage levels are output by the DAC using the first current provider 220 and the switching section 240. Thus, 32×32(= 1024) different voltage levels can be output by the DAC using the first and second current providers 220 and 230 and the switching section 240. In other words, the DAC of FIG. 3 converts 10-bit digital input signals into a corresponding analog signal that can have one of 1024 different voltage levels.

According to the current addition type DAC of FIG. 2, the first current provider 220 is connected to the PMOS transistor MPO1, and the second current provider 230 is connected to the PMOS transistor MPO2. Even though the transistor size of the PMOS transistor MPO2 is less than that of the PMOS transistor MPO1 by about 1/32, the PMOS transistor MPO2 connected to the NMOS transistor MNO2 may output a current 32 times larger than the current I outputted from the PMOS transistor MPO1.

In view of the above, in some embodiments according to the invention, the size of the PMOS transistor MPO2 is less than the size of the PMOS transistor MPO1. In some embodiments according to the invention, the size of the PMOS transistor MPO2 is about $1/32^{nd}$ the size of the PMOS transistor MPO. Moreover, despite the relatively small size of MPO2, PMOS transistor MPO2 can source about 32 times more current than the current sourced by the PMOS transistor MPO1.

In addition, even though each of the transistors MP6, . . . , MP36 connected to the PMOS transistor MPO2 is $1/32^{nd}$ the size of the PMOS transistor MPO1, the transistors MP6, . . . , MP36 may output a current 32 times larger than the current I output from the PMOS transistor MPO1. For example, the transistor size of the PMOS transistor MPO1 can be 4/2, whereas the transistor size of the PMOS transistor MPO2 can be 7/3. Therefore, when the DAC of FIG. 2 is implemented in a semiconductor integrated circuit, the layout area occupied by the DAC may be reduced.

Figure 4:
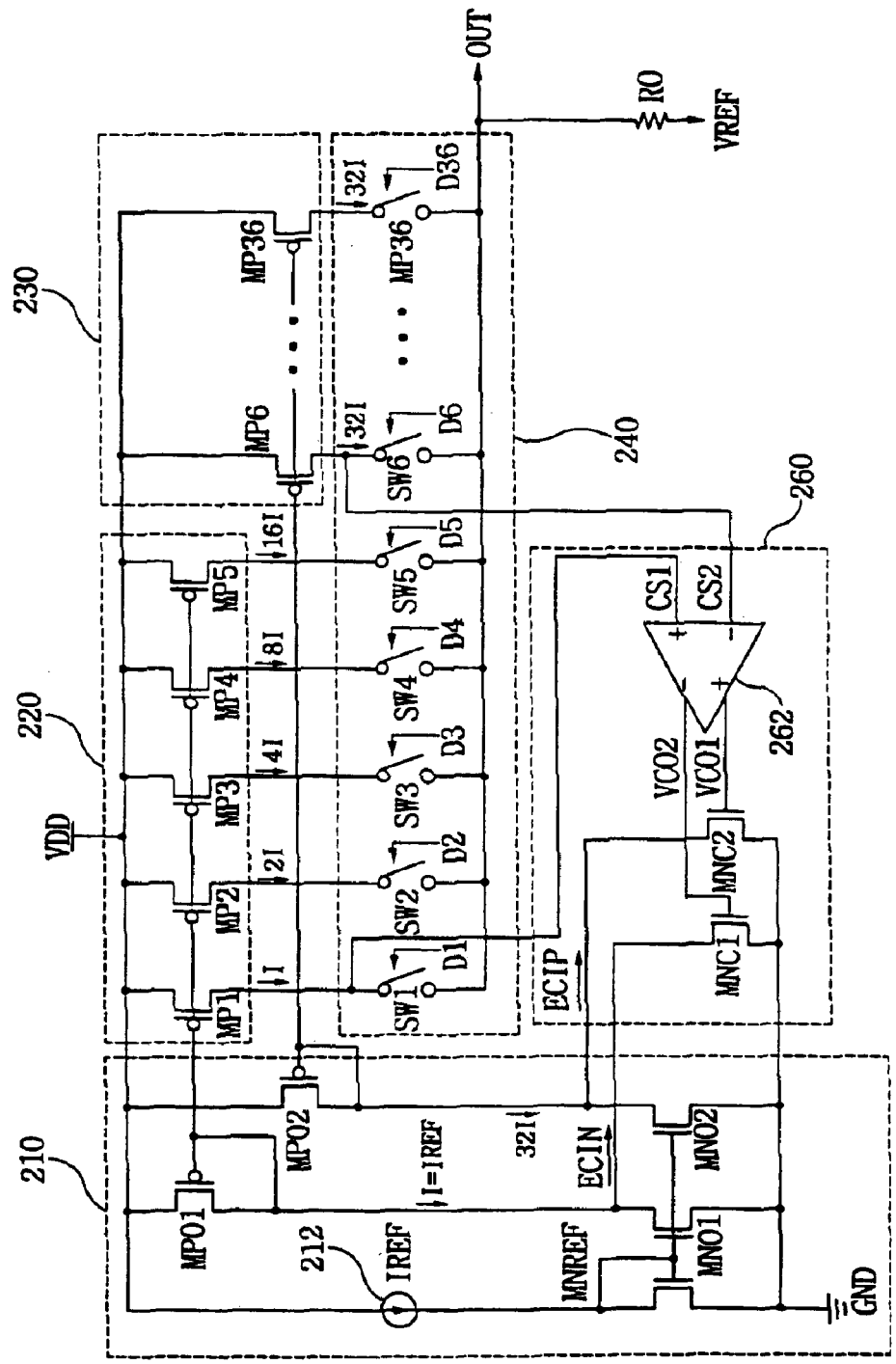
FIGS. 4–10 are circuit diagrams showing 10-bit current addition type digital-to-analog converters according to some embodiments of the invention.

Referring to FIG. 4, a current compensation circuit 260 receives one (CS1) of the signals output from the first current provider 220 and one (CS2) of the signals output from the second current provider 230, and generates error compensation signals ECIP and ECIN, which are provided to the current source 210.

The current compensation circuit 260 includes an error amplifier 262, an NMOS transistor MNC1 and a NMOS transistor MNC2. The error amplifier 262 receives a signal CS1 output from the first current provider 220 and a signal CS2 output from the second current provider 230, and amplifies each of the signals CS1 and CS2 to provide first and second amplified signals VCO1 and VCO2. The drain electrode of the NMOS transistor MNC2 is connected to a drain electrode of the second PMOS transistor MPO2 in the current source 210 and is responsive to the first amplified signal VCO1. The drain electrode of the NMOS transistor MNC1 is connected to a drain electrode of the first PMOS transistor MPO1 in the current source 210 and is responsive to the second amplified signal VCO2.

According to the DAC of FIG. 4, the current compensation circuit 260 may, therefore, sense the drain current CS1 of the PMOS transistor MP1 and the drain current CS2 of the PMOS transistor MP6 to reduce a current error. For example, when CS1 increases and CS2 decreases, VCO1 increases and VCO2 decreases. When VCO1 increases, the current ECIP in the NMOS transistor MNC2 increases. When VCO2 decreases, the current ECIN flowing in the NMOS transistor MNC1 decreases. Thus, the currents output from the PMOS transistors MP1, . . . , MP5 of the first current provider 220 decrease, and the currents outputted from the PMOS transistors MP6, . . . , and MP36 of the second current provider 230 increase.

For example, when CS1 decreases and CS2 increases, VCO1 decreases and VCO2 increases. When VCO1 decreases, the current ECIP in the NMOS transistor MNC2 decreases. When VCO2 increases, the current ECIN in the NMOS transistor MNC1 increases. Thus, the currents output from the PMOS transistors MP1, . . . , MP5 of the first current provider 220 increase, and the currents outputted from the PMOS transistors MP6, . . . , and MP36 of the second current provider 230 decrease.

The current compensation circuit 260 of FIG. 4 reduces the output currents of the first and second current providers 220 and 230 when the output currents of the first and second current providers 220 and 230 abnormally increase, and increases the output currents of the first and second current providers 220 and 230 when the output currents of the first and second current providers 220 and 230 abnormally decrease so as to compensate for fluctuations in currents provided by the first and second current providers 220 and 230.

In some embodiments according to the invention, it will be understood that the voltage levels, on which CS1 and CS2 are based, are about equal when the first and second current providers 220 and 230 operate nominally. When the voltage level changes (i.e., non-nominal operation) the current compensation circuit 260 adjusts the operation of the respective transistor MNC1 and MNC2 to increase or decrease the reference current generated by the respective transistor MPO1 and MPO2. Because the transistors MPO1 and MPO2 (that generate the reference currents) are connected in current mirror configurations with the respective transistors in the first and second current providers 220 and 230, the variation in the reference currents causes the currents generated by the first and second current providers 220 and 230 to vary as well, which causes the voltage levels, on which CS1 and CS2 are based, to change toward nominal operation.

Figure 5:
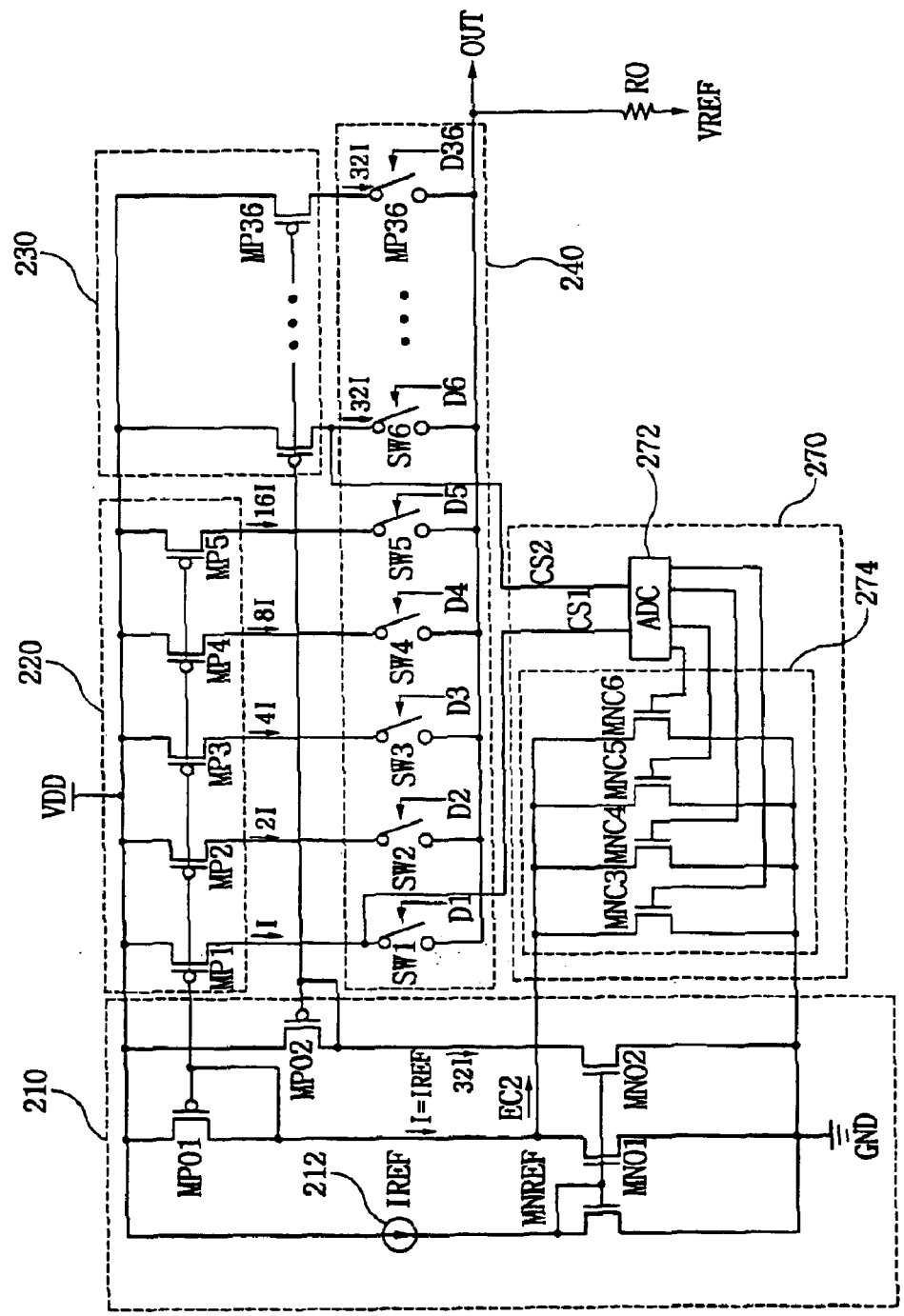

Referring to FIG. 5, the current compensation circuit 270 receives one (CS1) of the outputted signals of the first current provider 220 and one (CS2) of the outputted signals of the second current provider 230, and generates an error compensation signal (EC2) to provide the current source 210 with the error compensation signal (EC2).

The current compensation circuit 270 includes an analog-to-digital (ADC) converter 272 and a current regulating circuit 274. The analog-to-digital converter 272 receives an output signal (CS1) from the first current provider 220 and an output signal (CS2) from the second current provider 230, and converts CS1 and CS2 signals into, for example, 4-bit digital signals. The ADC 272 may output n-bit digital signals other than 4-bit digital signals.

The current regulating circuit 274 includes switching transistors MNC3, . . . , MNC6 connected in parallel with one another. The NMOS transistors MNC3, . . . , MNC6 are responsive to the digital signals output from the ADC 272 and generates an error compensation signal EC2. The error compensation signal EC2 is provided to the drain electrode of the first PMOS transistor MPO1.

Referring to the DAC of FIG. 5, in operation, the current compensation circuit 270 senses a drain current CS1 in the PMOS transistor MP1 of the first current provider 220 and a drain current CS2 in the PMOS transistor MP6 of the second current provider 230 so as to reduce current variations therein. In particular, the current compensation circuit 270 compares CS1 with CS2 and generates the value of the digital signals from the ADC 272 based on the result of the comparison, which determines the number of transistors that are turned-on among the NMOS transistors MNC3, . . . , MNC6. When the number of transistors turned-on increases, the amplitude of the error compensation signal EC2 increases. In contrast, as the number of transistors turned-off decreases, the amplitude of the error compensation signal EC2 decreases.

The drain electrodes of the NMOS transistors MNC3, . . . , MNC6 are commonly connected to the drain electrode of the first PMOS transistor MPO1. Thus, the current compensation circuit 270 changes the currents flowing through the PMOS transistors MP1, . . . , MP5 in the current-mirror configuration connected to the first PMOS transistor MPO1. For example, when CS1 increases more than CS2 increases (e.g., CS1 increases to more than CS2), the current compensation circuit 270 reduces the amplitude of the error compensation signal EC2 to reduce the currents flowing in the PMOS transistors MP1, . . . , MP5. Alternatively, when CS1 decreases more than CS2 decreases (e.g., CS1 decreases to less than CS2), the current compensation circuit 270 increases the amplitude of the error compensation signal EC2 and increases the currents flowing through the PMOS transistors MP1, . . . , MP5.

Accordingly, the current compensation circuit 270 of FIG. 5 can reduce the output currents of the first current provider 220 when the output currents of the first current provider 220 are abnormally increased, and can increase the output currents of the first current provider 220 when the output currents of the first current provider 220 are abnormally decreased to reduce current fluctuations therein.

Figure 6:
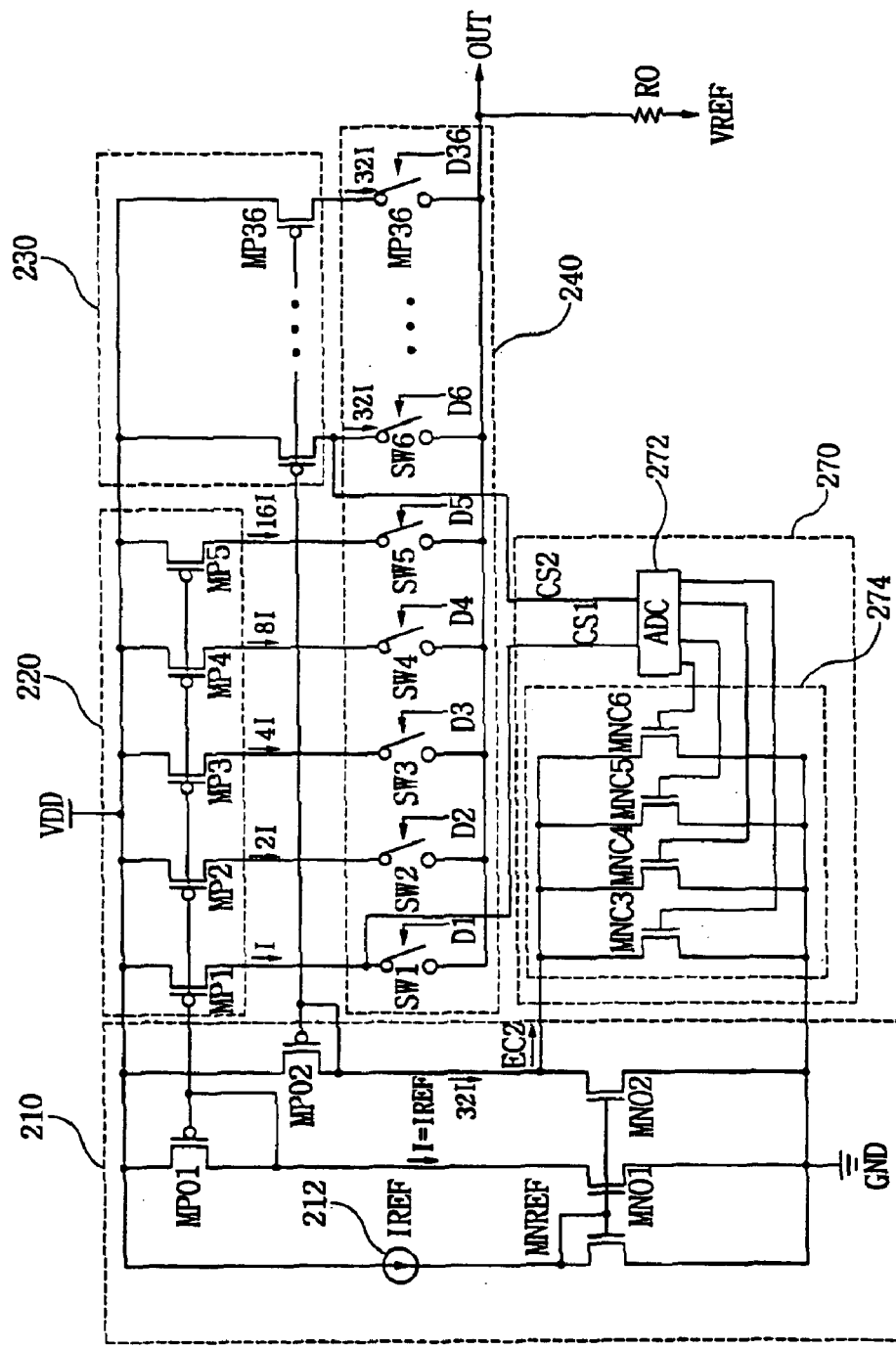

FIG. 6 is a circuit diagram showing a 10-bit current addition type digital-to-analog converter according to some embodiments of the invention. The DAC of FIG. 6 has substantially the same configuration as the DAC of FIG. 5 except that an error compensation signal EC2 output from the current compensation circuit 270 can change the currents flowing in the second PMOS transistor MPO2 of the current source 210 to effect the currents generated by the second current provider 230.

The current compensation circuit 270 of FIG. 6 can reduce the output currents of the second current provider 230 when the output currents of the second current provider 230 are abnormally increased, and can increase the output currents of the second current provider 230 when the output currents of the second current provider 230 are abnormally decreased to reduce current fluctuations therein.

Although the embodiments illustrated in FIG. 6 perform the error compensation operations by receiving one of the output signals of the respective first and second current provider 220 and 230, the DAC may perform the error compensation operation by receiving at least two output signals of the respective first and second current providers 220 and 230.

In the conventional current error compensation method, as shown in FIG. 1, all the outputted currents of the transistors MP1, MP2, . . . , MP36 are sensed so as to regulate the voltage level at the output terminal OUT of the DAC. Therefore, the current compensation circuit is complicated and the conventional DAC consumes a lot of power.

However, in some embodiments of current error compensation circuits according to the invention, as shown, for example, in FIGS. 4, 5 and 6, only one of the output signals of the first current provider 220 and only one of the output signals of the second current provider 230 are sensed, and are fed back to the current source 210 to regulate the output currents of the first and second current providers 220 and 230. Therefore, the current compensation circuits of FIGS. 4, 5 and 6 may be of reduced complexity and may consume less power.

Figure 7:
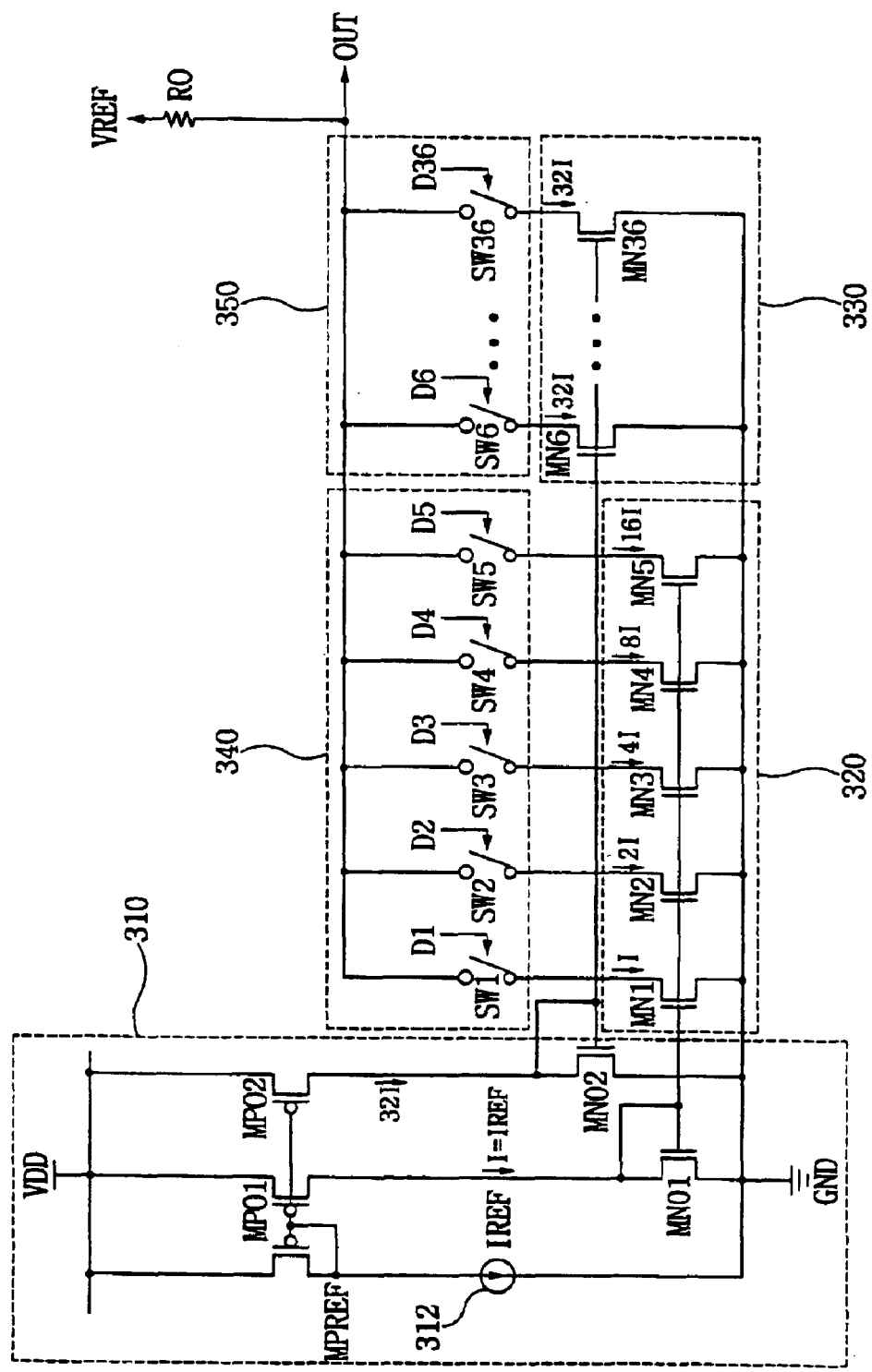

FIG. 7 is a circuit diagram showing a 10-bit current addition type DAC according to some embodiments of the invention. In the DAC of FIG. 7, a current provider is connected to an earth potential. The current addition type DAC includes a current source 310, a first current provider 320, a second current provider 330, a first switching section 340, a second switching section 350 and a switch control signal generator (not shown). An output resistor RO is connected between an output terminal OUT and a reference voltage VREF. The reference voltage VREF is referred to as an output voltage of the DAC when digital input signals equal to "0" are input to the DAC. The switch control signal generator receives 10-bit digital input signals DIN1, DIN2, . . . , DIN10 to generate $(5+(2^5-1)=36)$ switch control signals D1, D2, . . . , D36.

As shown in FIG. 7, the current source 310 includes a reference current source 312, a first PMOS transistor MPREF, a second PMOS transistor MPO1, a third PMOS transistor MPO2, a first NMOS transistor MNO1 and a second NMOS transistor MNO2. A first end of the reference current source 312 is coupled to an earth potential, and generates a reference current signal IREF. The first NMOS transistor MNO1 has a diode-configuration structure, and generates a first current signal I. The second NMOS transistor MNO2 has a diode-configured structure, and generates a second current signal 32I. The first PMOS transistor MPREF has a drain electrode and a gate electrode that are commonly connected to a second end of the reference current source 312. A gate electrode of the second PMOS transistor MPO1 is connected to a gate electrode of the first PMOS transistor MPREF, a source electrode of the second PMOS transistor MPO1 is connected to a voltage VDD, and a source electrode of the second PMOS transistor MPO1 is connected to a source electrode of the first PMOS transistor MPREF. A gate electrode of the third PMOS transistor MPO2 is connected to the gate electrode of the first PMOS transistor MPREF, a source electrode of the third PMOS transistor MPO2 is connected to the voltage VDD, a drain electrode of the third PMOS transistor MPO2 is connected to a drain electrode of the second NMOS transistor MNO2.

Referring still to FIG. 7, the first current provider 320 includes NMOS transistors MN1, . . . , MN5 connected in current-mirror configuration. The NMOS transistors MN1, . . . , MN5 are commonly connected to the first NMOS transistor MNO1 of the current source 310. The first current provider 320 generates current signals having different amplitudes, such as I, 2I, 4I, 8I and 16I.

The second current provider 330 includes NMOS transistors MN6, . . . , MN36 connected in current-mirror configuration. The NMOS transistors MN6, . . . , MN36 are commonly connected to the second NMOS transistor MNO2 of the current source 310. The second current provider 330 generates current signals each having same amplitudes, such as 32I.

The first switching section 340 is connected between output terminals of the first current provider 320 and the output terminal OUT of the DAC. The first switching section 340 includes a plurality of switches SW1, ..., SW5. The switches SW1, ..., SW5 perform a switching operation in response to switch control signals D1, ..., D5.

The second switching section 350 is connected between output terminals of the second current provider 330 and the output terminal OUT of the DAC. The second switching section 350 includes a plurality of switches SW6, ..., SW36. The switches SW6, ..., SW36 perform a switching operation in response to switch control signals D6, ..., D36. It will be appreciated by those skilled in the art that the DAC of FIG. 7 can operate similarly to the DAC of FIG. 2.

Figure 8:
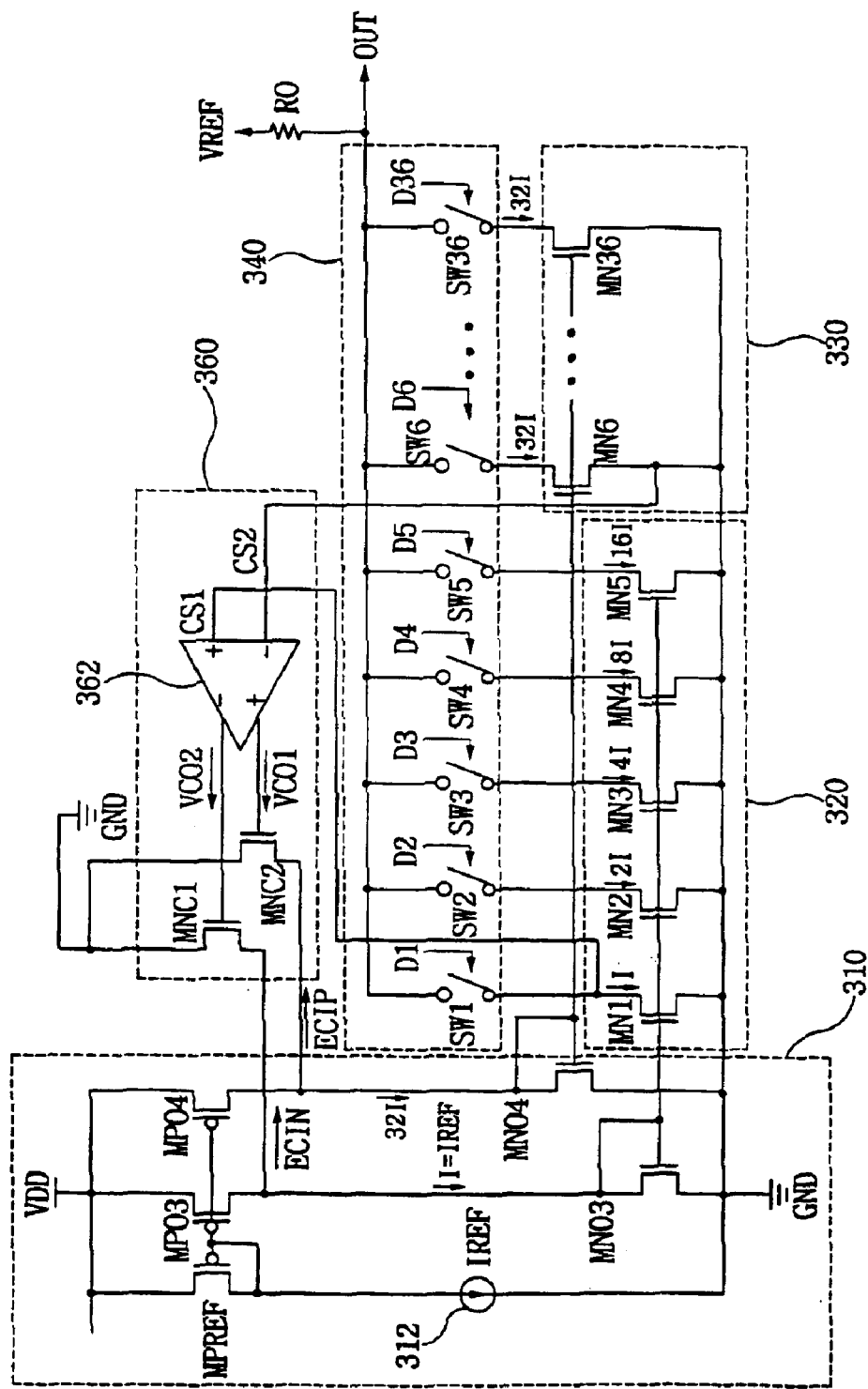

FIG. 8 is a circuit diagram showing a 10-bit current addition type DAC according to some embodiments of the invention. It will be appreciated by those skilled in the art that the DAC of FIG. 8 is similar in operation and structure to that of the DAC of FIG. 4. For example, many of the PMOS transistors shown in FIG. 4 have been replaced by NMOS transistors shown in FIG. 8.

Figure 9:
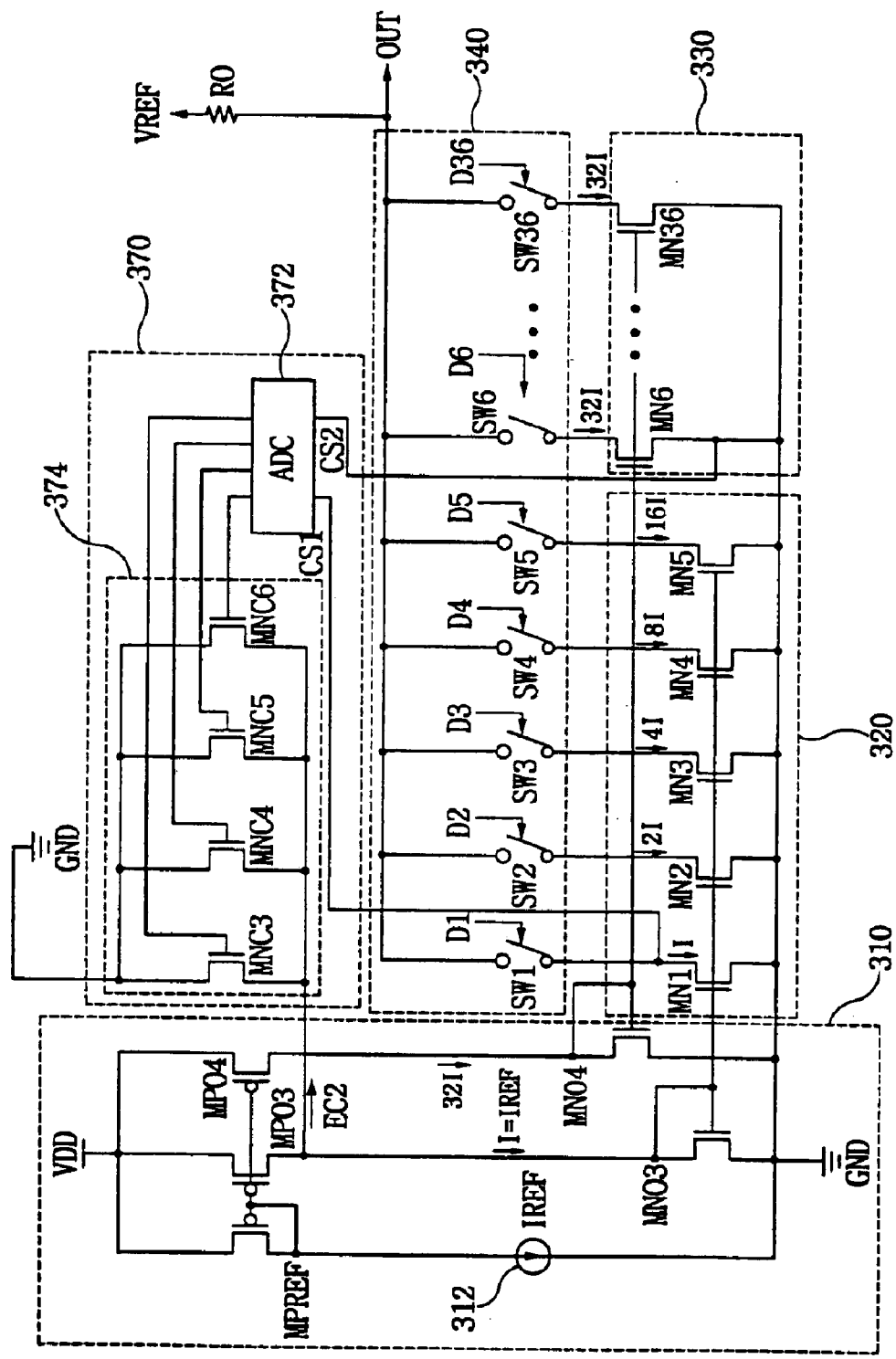

FIG. 9 is a circuit diagram showing a 10-bit current addition type DAC according to a some embodiments of the invention. It will be appreciated by those skilled in the art that the DAC of FIG. 9 is similar in operation and structure to that of the DAC of FIG. 5. For example, many of the PMOS transistors shown in FIG. 5 have been replaced by NMOS transistors shown in FIG. 9.

Figure 10:
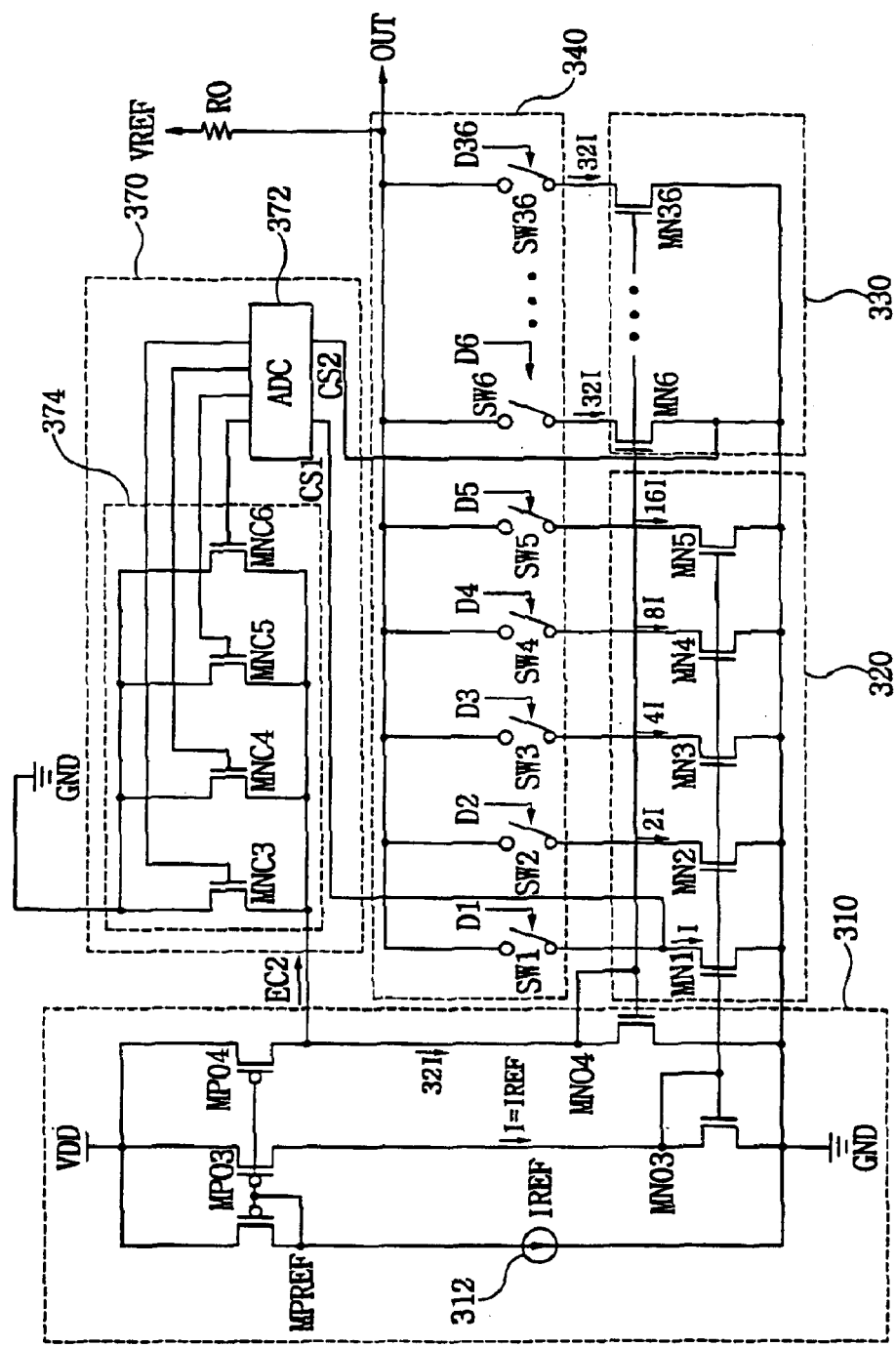

FIG. 10 is a circuit diagram showing a 10-bit current addition type DAC according to some embodiments of the invention. It will be appreciated by those skilled in the art that the DAC of FIG. 10 is similar in operation and structure to that of the DAC of FIG. 6. For example, many of the PMOS transistors shown in FIG. 6 have been replaced by NMOS transistors shown in FIG. 10.

FIG. 11 is a table showing examples of combinations of the number of transistors in a first current provider and a second current provider in some embodiments according to the invention, where k is a natural number=m+n, m and n are natural numbers less than k. In particular, in a k-bit DAC according to some embodiments of the invention illustrated in FIG. 11, the number "m" can represent the number of transistors in the first current provider, which corresponds to the lower bits of the k-bit DAC, and the $2^n-1$ number can represent the number of transistors in the second current provider, corresponding to the upper bits of the k-bit DAC.

It will also be understood that the above numbers can represent the size occupied by the first and second current providers. For example, when a particular embodiment according to the invention is described as: 5/31 in FIG. 11, the first current provider occupies 5 transistor unit areas whereas the second current provider occupies 31 transistor unit areas. Further, in the case of a 10-bit DAC (k=10), the first current provider corresponding to the lower bits includes 5 transistors (m=5) and the second current provider corresponding to the upper bits includes 31 transistors (n=5). The number of transistors in the first current provider (or size occupied by the transistors in the first current provider) may increase according to $2^r$ (where "r" is a natural number). The transistors of the second current provider may have the same transistor size. When the transistor size of the transistor corresponding to a least significant bit is 1, the total transistor size of the transistors of the DAC is (1+2+4+8+16+32×31), or 1023.

Alternatively, when the first current provider includes transistors associated with the lower 4 bits of the input (m=4), the second current provider corresponding to upper bits has 63 transistors (n=6). Thus, the total area occupied by the transistors of the DAC can be expressed as: (1+2+4+8+16+16×63), or 1023. Namely, even though the number of transistors included in each of the first and second current providers is changed, the total area occupied by the transistors in the first and second current providers can remain the same.

Figure 12:
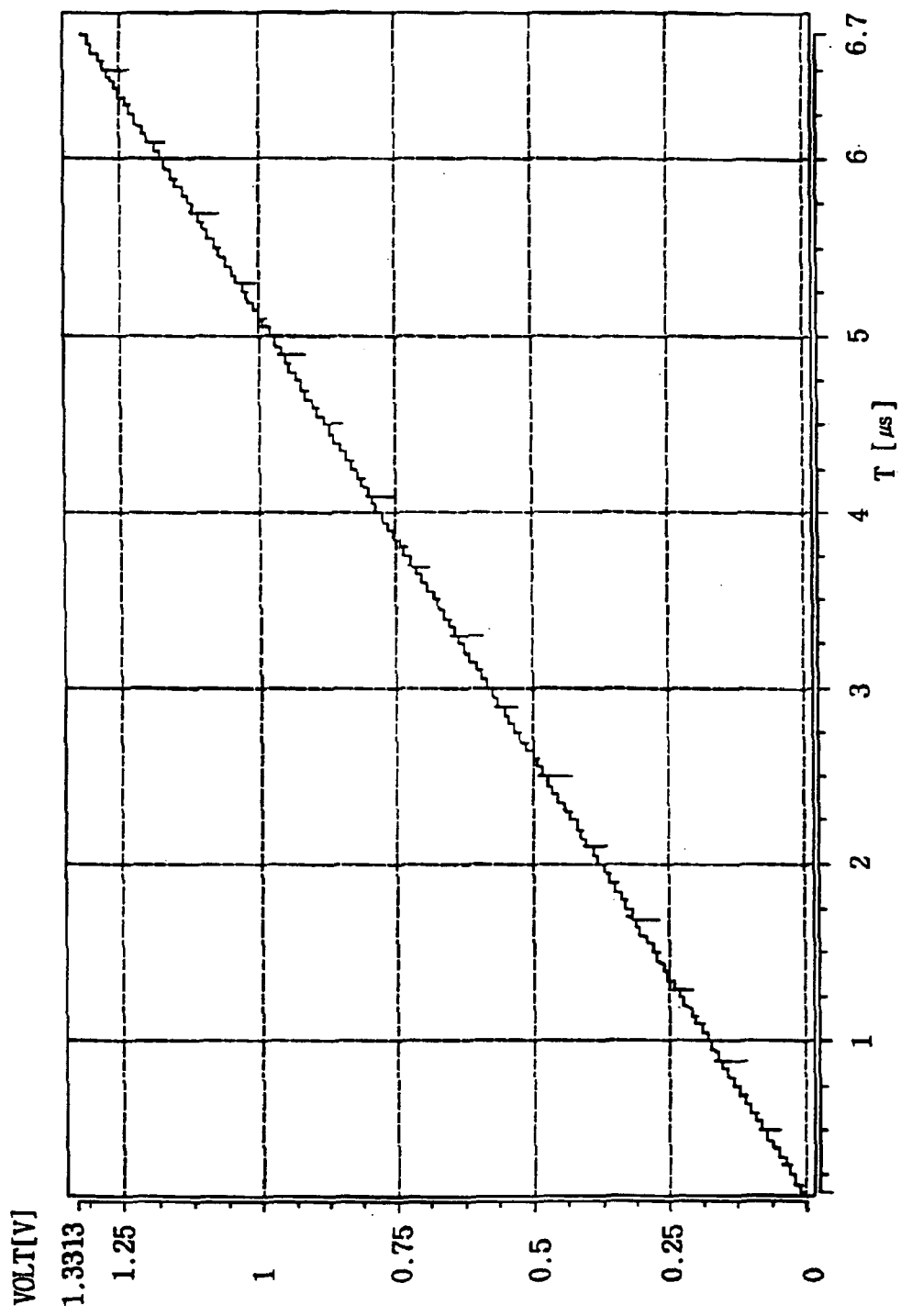
FIG. 12 is a graph showing an output signal of a 10-bit current addition type digital-to-analog converter according to some embodiments of the invention.

FIG. 12 represents the waveform of an exemplary output signal at the output terminal of an 8-bit current addition type DAC according to some embodiments according to the invention, where an 8 bit digital input signal ranges in value from "0000 0000" to "1111 1111". As shown in FIG. 12, the output signal has 256 voltage level in a range from about 0 volt to about 1.33 volts.

Although the embodiments described herein include two current providers, DACs according some embodiments of the invention can include more than two current providers.

Many alterations and modifications may be made by those having ordinary skill in the art, given the benefit of present disclosure, without departing from the spirit and scope of the invention. Therefore, it must be understood that the illustrated embodiments have been set forth only for the purposes of example, and that it should not be taken as limiting the invention as defined by the following claims. The following claims are, therefore, to be read to include not only the combination of elements which are literally set forth but all equivalent elements for performing substantially the same function in substantially the same way to obtain substantially the same result. The claims are thus to be understood to include what is specifically illustrated and described above, what is conceptually equivalent, and also what incorporates the essential idea of the invention.

What is claimed:

1. An N bit Digital-to-Analog Converter (DAC) comprising independently sized first and second current source transistors coupled to respective pluralities of first and second current provider transistors in current mirror configurations, wherein the first and second current provider transistors are sized proportionally to the first and second current source transistors respectively.

2. An N bit Digital-to-Analog Converter (DAC) comprising:
a first current provider circuit configured to provide a plurality of first current signals responsive to a plurality of first bits of an N bit data word weighted differently based on a first reference current; and
a second current provider circuit configured to provide a plurality of second current signals responsive to a plurality of second bits of the N bit data word weighted equally based on a second reference current that is different than the first reference current.

3. An N bit DAC according to claim 2 wherein the first current provider circuit comprises a plurality of transistors of different sizes based on the first reference current.

4. An N bit DAC according to claim 3 wherein the different sizes of the plurality of transistors are further based on respective orders of data bits of the N bit data word to which each of the respective transistors is coupled.

5. An N bit DAC according to claim 3 wherein the first current signals have associated respective magnitudes determined based on the different sizes of the plurality of transistors.

6. An N bit DAC according to claim 3 wherein respective source/drain terminals of the plurality of transistors are coupled to the plurality of first bits.

7. An N bit DAC according to claim 3 wherein the plurality of transistors comprises a plurality of first transistors, wherein the second current provider circuit comprises a plurality of second transistors of about equal sizes based on the second reference current.

8. An N bit DAC according to claim 7 further comprising:
a first current source transistor coupled to the plurality of first transistors that is configured to provide the first reference current, wherein the first current source transistor has a size about equal to a lowest order one of the plurality of first transistors; and
a second current source transistor coupled to the plurality of second transistors that is configured to provide the second reference current, wherein the second current source transistor has a size about equal to all of the plurality of second transistors.

9. An N bit DAC according to claim 8 wherein the first and second current source transistors are sized independently of one another.

10. An N bit DAC according to claim 7 wherein source/drain terminals of the pluralities of first and second transistors are not coupled to separate resistor components.

11. An N bit DAC according to claim 7 wherein source/drain terminals of the pluralities of first and second transistors are each coupled to respective switches configured to switch respective bits of the N bit data word to the ones of the pluralities of first and second transistors.

12. An N bit DAC according to claim 2 wherein the plurality of first bits comprise lower order bits of the N bit data word and the plurality of second bits comprise high order bits of the N bit data word that are higher order than the plurality of first bits, wherein the second reference current is about $2^m$ times as large as the first reference current, wherein m equals a lowest order one of the high order bits.

13. An N bit DAC according to claim 2 wherein the first current provider circuit comprises a plurality of first transistors having different respective sizes relative to one another and the second current provider circuit comprises a plurality of second transistors having about equal sizes relative to one another.

14. An N bit DAC according to claim 2 further comprising:
first and second current source transistors coupled to the first and second current provider circuits respectively; and
a current correction circuit coupled to the first and second current provider circuits and coupled to at least one of the first and second current source transistors and configured to change at least one of the first and second reference currents based on a difference between voltage levels provided by the first and second current provider circuits.

15. An N bit DAC according to claim 14 wherein the current correction circuit is coupled to the first and second current source transistors and is configured to change the first and second reference currents based on the difference.

16. An N bit DAC according to claim 14 wherein the current correction circuit comprises an analog-to-digital converter circuit to convert the voltage levels provided by the first and second current provider circuits to decoded digital signals representing a correction to the first or second reference current.

17. An N bit DAC according to claim 16 further comprises:
a plurality of current correction transistors coupled to the analog-to-digital converter circuit and at least one of the first and second current source transistors and responsive to the decoded digital signals to change the first and second reference currents.

18. An N bit Digital-to-Analog Converter (DAC) comprising:
a current correction circuit configured to change at least one of first and second reference currents provided in proportion to respective sizes of transistors included in associated first and second current provider circuits based on a difference between voltage levels provided by the first and second current provider circuits.

19. An N bit DAC according to claim 18 further comprising:
first and second current source transistors coupled to the first and second current provider circuits respectively, wherein the current correction circuit is coupled to the first and second current source transistors and is configured to change the first and second reference currents based on the difference.

20. An N bit DAC according to claim 18 wherein the current correction circuit comprises an analog-to-digital converter circuit to convert the voltage levels provided by the first and second current provider circuits to decoded digital signals representing a correction to the first or second reference current.

21. An N bit DAC according to claim 20 further comprises:
a plurality of current correction transistors coupled to the analog-to-digital converter circuit and at least one of the first and second current source transistors and responsive to the decoded digital signals to change the first and second reference currents.

22. A method of operating an N bit Digital-to-Analog Converter (DAC) comprising:
providing a plurality of first current signals responsive to a plurality of first bits of an N bit data word weighted differently based on a first reference current; and
providing a plurality of second current signals responsive to a plurality of second bits of the N bit data word weighted equally based on a second reference current that is different than the first reference current.

23. A method according to claim 22 wherein the plurality of first current signals are provided by a plurality of transistors of different sizes based on the first reference current.

24. A method according to claim 23 wherein the different sizes of the plurality of transistors are further based respective orders of data bits of the N bit data word to which each of the respective transistors is coupled.

25. A method according to claim 23 wherein the first current signals have associated respective magnitudes determined based on the different sizes of the plurality of transistors.

26. A method according to claim 23 wherein respective source/drain terminals of the plurality of transistors are coupled to the plurality of first bits.

* * * * *